(12) United States Patent
Fatemizadeh (10) Patent No.: US 6,242,972 B1
(45) Date of Patent: Jun. 5, 2001

(54) CLAMP CIRCUIT USING PMOS-TRANSISTORS WITH A WEAK TEMPERATURE DEPENDENCY

(75) Inventor: Badredin Fatemizadeh, Sunnyvale, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/428,291

(22) Filed: Oct. 27, 1999

(51) Int. Cl.[7] ............................................. G05F 1/10
(52) U.S. Cl. ................................. 327/538; 327/328
(58) Field of Search .......................... 327/309, 327, 327/328, 530, 534, 535, 537, 538, 540, 541, 543, 545, 546

(56) References Cited

U.S. PATENT DOCUMENTS

| 5,252,909 | * | 10/1993 | Aizaki | 323/313 |
| 5,532,578 | * | 7/1996 | Lee | 323/313 |
| 5,592,119 | * | 1/1997 | Yoo | 327/530 |
| 5,757,225 | * | 5/1998 | Tobita | 327/539 |
| 5,892,390 | * | 4/1999 | Tobita | 327/543 |
| 6,111,457 | * | 8/2000 | Lim et al. | 327/541 |

* cited by examiner

Primary Examiner—Jeffrey Zweizig
(74) Attorney, Agent, or Firm—Gray Cary Ware & Freidenrich LLP (57) ABSTRACT

A clamp circuit is provided wherein the clamp device is a PMOS transistor. This clamp circuit is particularly suited for applications requiring weak temperature dependency of a reference voltage. In some embodiments, some temperature dependency is tolerated in exchange for improved clamp characteristics (realized, for example, by operating the PMOS clamp transistor in the high current region).

12 Claims, 9 Drawing Sheets

CLAMP CIRCUIT USING PMOS-TRANSISTORS WITH A WEAK TEMPERATURE DEPENDENCY

TECHNICAL FIELD

The present invention relates to clamp circuits and, in particular, to a clamp circuit that employs PMOS transistors so that the clamp circuit has a weak temperature dependency.

BACKGROUND

Figure 15:
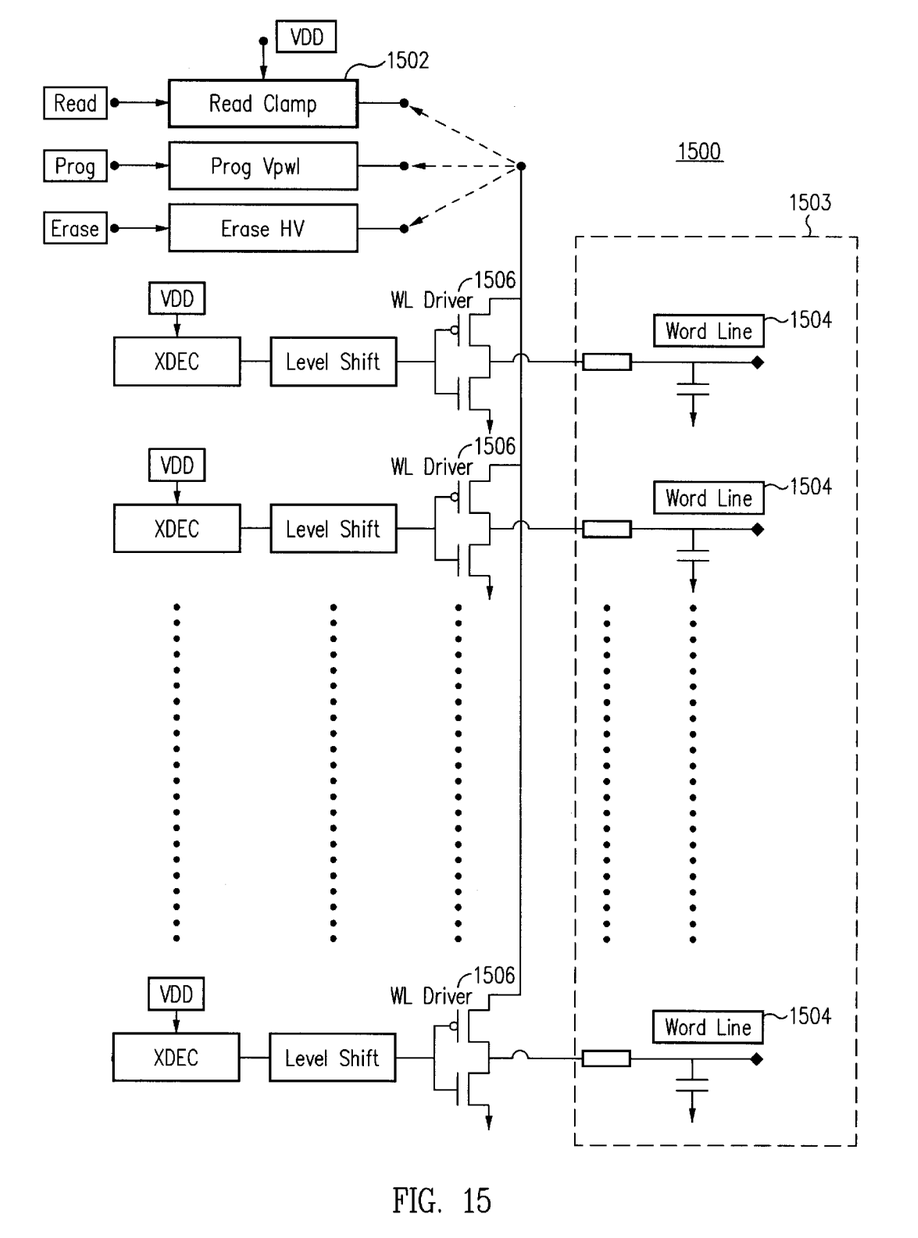
FIG. 15 illustrates the application of a clamp circuit in a circuit for reading data lines from a memory array.

There are a number of circuits that require a reference voltage that is lower than the supply voltage VDD. As one example, FIG. 15 shows the application of a clamp circuit 1502 in a circuit 1500 for reading data from word lines 1504 of a memory cell array 1503. During the read operation of the memory cell array 1503, the clamp circuit 1502 provides the reference voltage for the WL (word line) drivers 1506 to read a selected one of the word lines 1504. The clamp circuit 1502 controls the reference voltage of the WL driver 1506 so that the voltage applied to the WL driver 1506 behaves within the allowed operation window of the WL driver 1506.

Band gap references are not suitable for use as a read voltage because of the long response time (typically greater than 500 ns). Common conventional clamp circuits used as a read voltage reference include either a diode or PNP transistor to function as the clamp.

Figure 1:
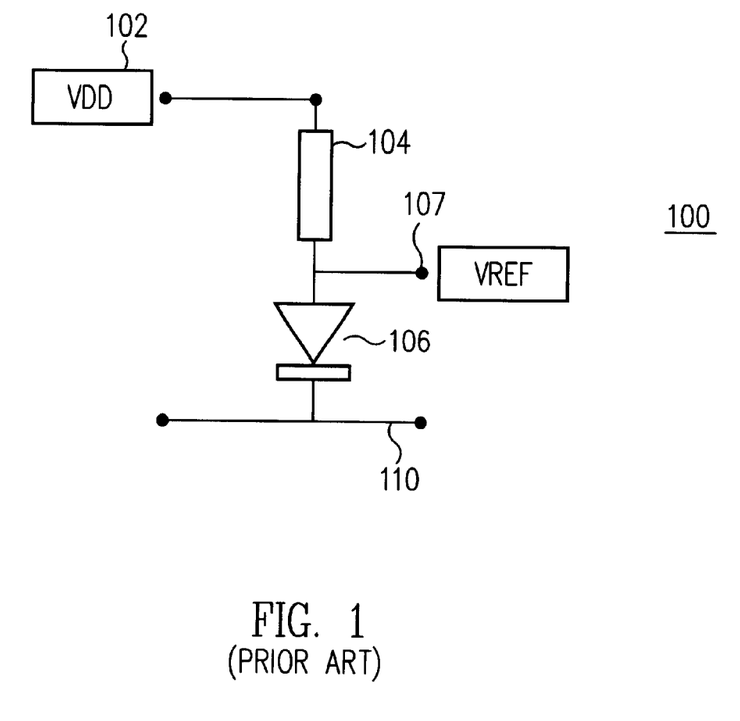
FIG. 1 illustrates a conventional diode-based clamp circuit.
Figure 2A:
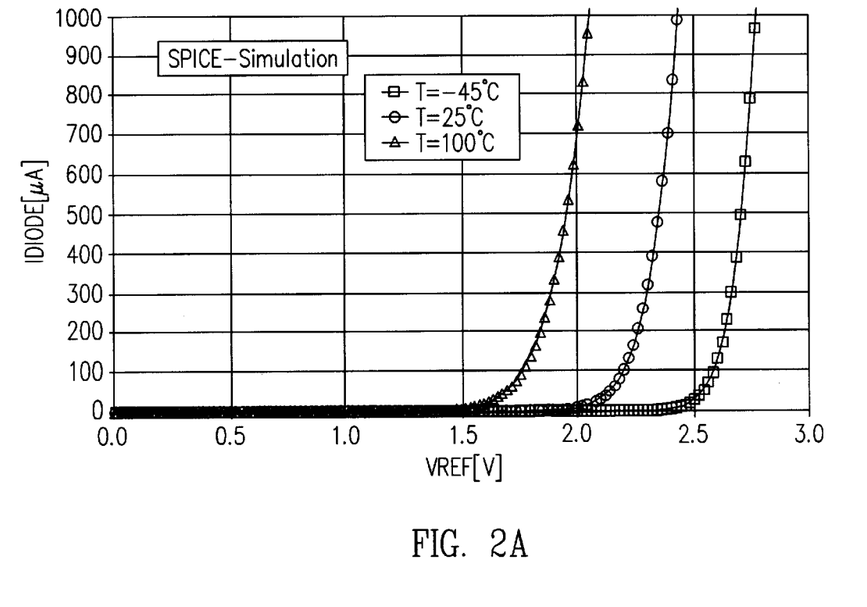
FIG. 2A illustrates the IV characteristics of a simulated clamp circuit having the FIG. 1 configuration (with three PNP transistors as the diode) at various temperatures.
Figure 2B:
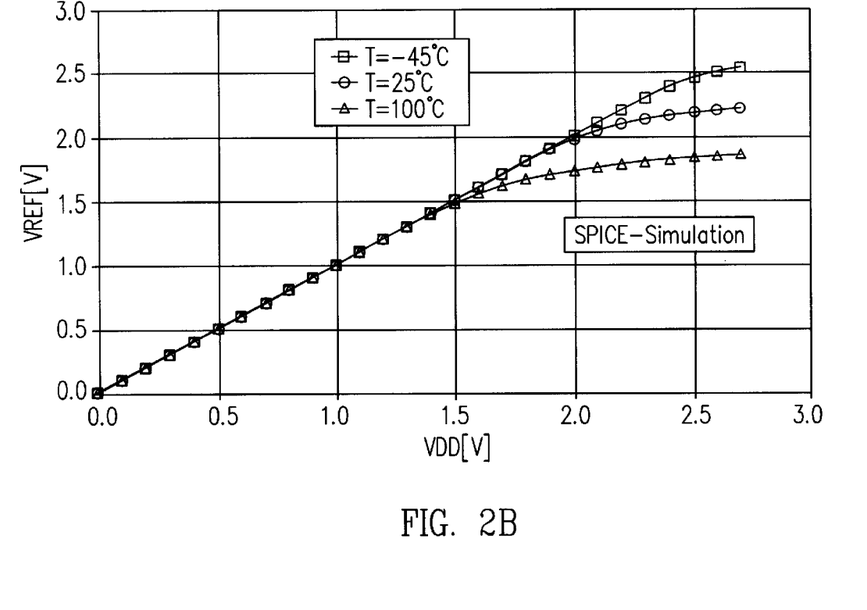
FIG. 2B illustrates the VREF-VDD relationship of the simulated clamp circuit at various temperatures.

The basic functioning of a clamp circuit is discussed with reference to FIG. 1, which illustrates a conventional clamp circuit 100 employing a diode 106 as the clamp. A power supply 102 is connected via a resistance 104 to a point 107 at which it is desired to maintain a reference potential VREF. The point 107 is connected to ground 110 by the diode 106. In operation, whenever the potential at point 107 starts to rise above the potential VREF, the diode 106 starts to conduct such that the point 107 is connected to point 110 by a very low resistance, thus tending to maintain the potential at the point 107 at VREF. In practice, one or more PNP transistors are employed as the diode 106. A major disadvantages of a diode clamp circuit such as that illustrated in FIG. 1 is the strong temperature dependency of the current-voltage (IV) characteristics of the diode 106. This strong temperature dependency translates to insufficient clamp at high and low temperatures. FIG. 2A shows the IV-characteristics of a clamp circuit employ three PNP transistors in series as the diode 106, and FIG. 2B shows the voltage clamp characteristics of the three PNP transistors in series. It can be seen from FIGS. 2A and 2B that the reference voltage of the clamp circuit employing three PNP transistors in series as the diode is too high at low temperatures and also is too low at high temperatures. At very low temperatures (e.g., at 45° C.), the circuit 100 exhibits virtually no clamp characteristics at all.

Using an NMOS transistor as a clamp device is not seen as being practical, because the gate should bias at a voltage range greater than the reference voltage, which is more difficult to control under different conditions such as temperature.

What is desired is a clamp circuit that operates substantially consistently over a wide temperature range.

SUMMARY

A clamp circuit is provided wherein the clamp device is a PMOS transistor. This clamp circuit is particularly suited for applications requiring weak temperature dependency of a reference voltage. In some embodiments, some temperature dependency is tolerated in exchange for improved clamp characteristics (realized, for example, by operating the PMOS clamp transistor in the high current region).

DETAILED DESCRIPTION

Figure 5:
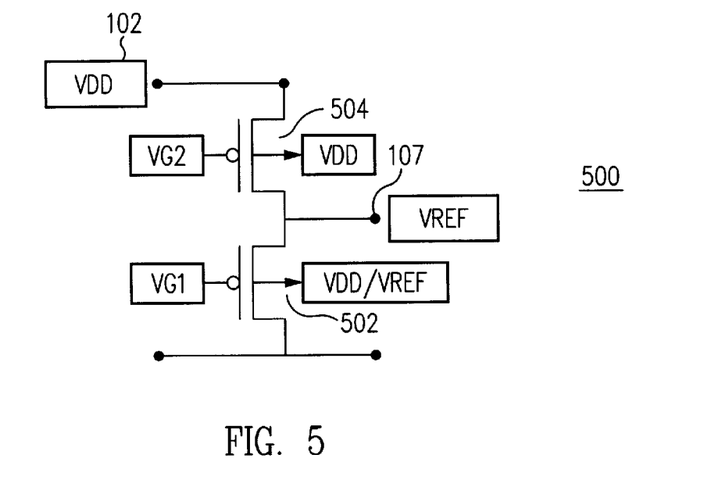
FIG. 5 illustrates one embodiment of a PMOS transistor clamp circuit in accordance with the invention.

In its basic aspect, the present invention employs a PMOS transistor as a clamp device in a clamp circuit such as is shown in FIG. 5. Before discussing the details of the FIG. 5 circuit, it is instructive to examine some of the characteristics of a PMOS transistor.

Figure 3:
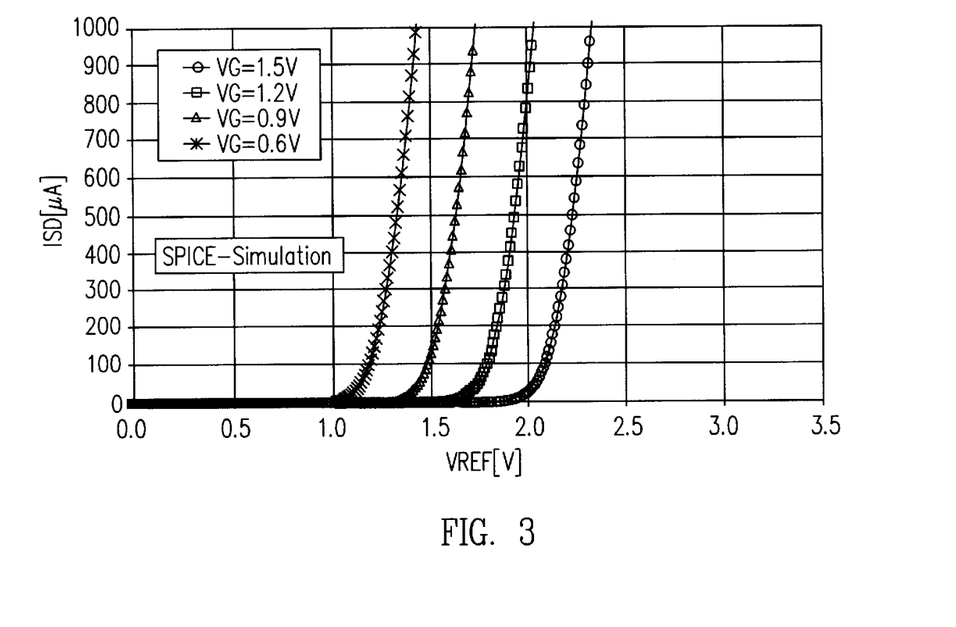
FIG. 3 illustrates the IV characteristics of the simulated FIG. 1 clamp circuit at various gate voltages.
Figure 4:
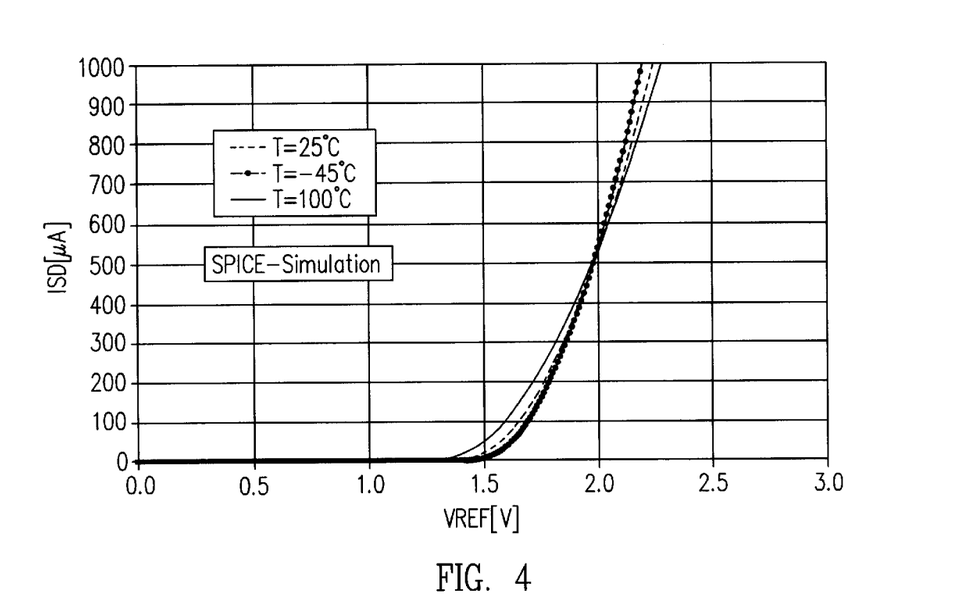
FIG. 4 illustrates the IV characteristics of a simulated PMOS transistor clamp circuit, in accordance with an embodiment of the invention, at various temperatures.

First, FIG. 3 illustrates the IV characteristics of a PMOS transistor at various gate bias voltages. Typically, a relatively large PMOS transistor width is required. FIG. 4 illustrates IV characteristics of a PMOS transistor at various temperatures. Comparing FIG. 4 to FIG. 2A, it can be seen that the slope of IV characteristics of a PMOS transistor is not as sharp as the IV characteristic curve of diode-type clamp devices. However, a PMOS transistor as a clamp device does have advantages over using a diode. For example, the threshold point of the clamp characteristics can be fairly precisely controlled by adjusting the gate bias. The "threshold point" of an ideal clamp device is the voltage point in the IV-characteristics, at which the clamp device is starting to conduct high current. In other words, after reaching the threshold point, the clamp voltage will not significantly change even with an increase in the load. By contrast, the threshold point of the diode-type clamp device is primarily determined by the process, and the clamp circuit designer has little or no flexibility to adjust it.

Furthermore, the temperature dependency of the PMOS transistor in clamp operation is much weaker than that of either a diode or a PNP transistor. In addition, as is discussed in greater detail later, by configuring the transistor width of the PMOS transistor for a particular current and gate bias voltage level, the PMOS transistor can be operated in the transition region from negative to positive temperature coefficient-namely the region with TC=0. See FIG. 4, which shows that at approximately I=600 μA and V=2.0V, the IV characteristics of one particular PMOS device is virtually temperature independent.

Turning now to FIG. 5, this figure shows a PMOS transistor (element 502) employed as a clamp device in a clamp circuit 500. In the FIG. 5 circuit 500, a PMOS transistor 504 provides the resistance of the clamp circuit 500 (like the resistance 104 in the FIG. 1 circuit 100) while reducing variation in VREF with VDD and also regulating the current through PMOS transistor 502 to be substantially constant over a wide range of VDD. The threshold point of the clamp characteristics of the PMOS transistor 502 may be adjusted using the gate bias VG2 of the PMOS transistor 504. (In some embodiments, the bulk of PMOS transistor 502 is connected to output terminal 107.) By contrast, the threshold point of a conventional diode clamp circuit (such as the FIG. 1 diode clamp circuit 100) is mainly determined by fabrication process and is not adjustable in operation of the clamp circuit.

Furthermore, by adjusting the transistor width of the PMOS transistor 502 to a particular current and gate bias voltage level), the PMOS transistor 502 can be controlled to operate in the transition region from negative to positive temperature coefficient (namely the region with TC=0). Also, to reduce the changes in VREF due to PMOS transistor 502 operating at or above the threshold point, the bulk of the PMOS transistor 502 may be connected to the VREF terminal 107, thus minimizing the body effect using the clamp action itself.

Figure 6:
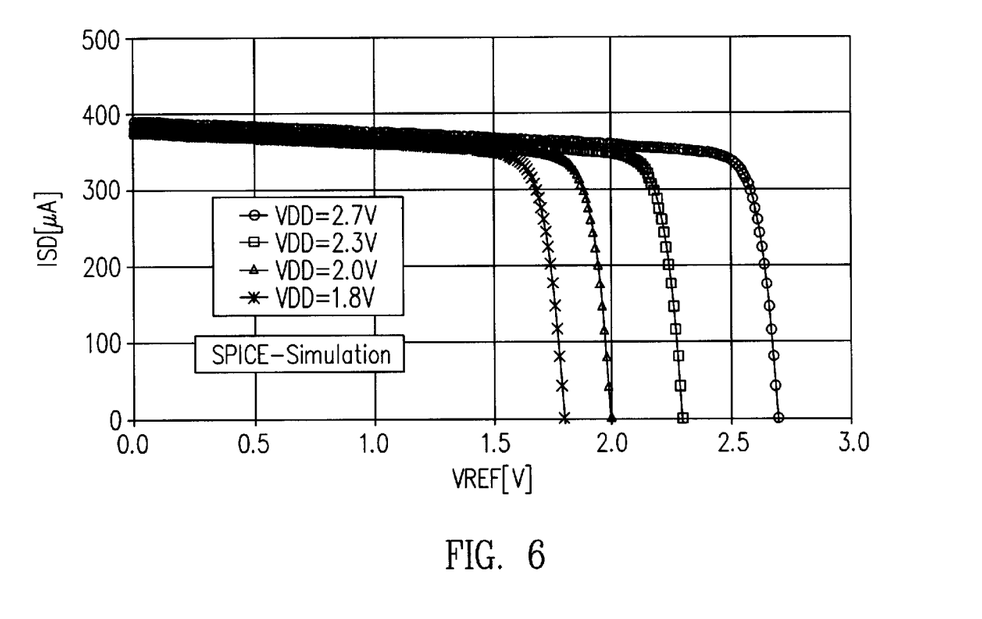
FIG. 6 illustrates the IV characteristics of a simulated PMOS transistor clamp circuit having the FIG. 5 configuration at various VDD's.

FIG. 6 is a graph derived from a simulation of a circuit having the FIG. 5 configuration. The FIG. 6 graph shows that the variation in VREF with VDD at terminal 107 is substantially reduced from the FIG. 1 configuration, and a substantially constant current level is provided through the transistors for a wide range of VDD. Perhaps more significantly, the temperature dependency of VREF in the FIG. 5 circuit is much weaker than a clamp circuit employing a diode or PNP transistor.

Figure 7:
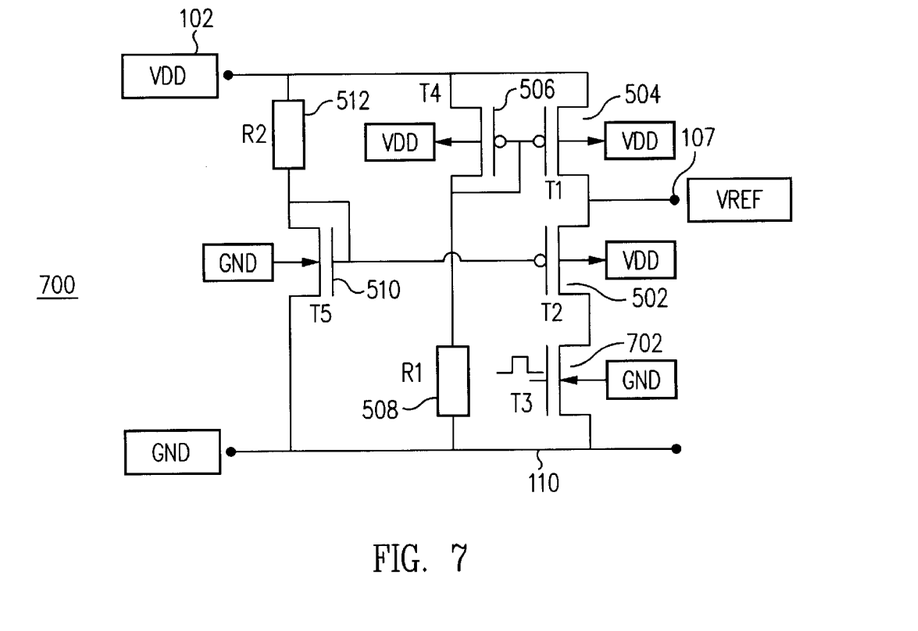
FIG. 7 illustrates one detailed embodiment of the FIG. 5 PMOS transistor clamp circuit.

In one particular embodiment of the FIG. 5 circuit, shown in FIG. 7, gate bias voltages VG1 and VG2 (for PMOS transistors 502 and 504, respectively) are provided with a VT-reference. That is, the combination of transistor 506 and resistance 508 provide the VT-reference for VG2 (See FIG. 5) and the combination of transistor 510 and resistance 512 provide the VT-reference for VG1.

Figure 8:
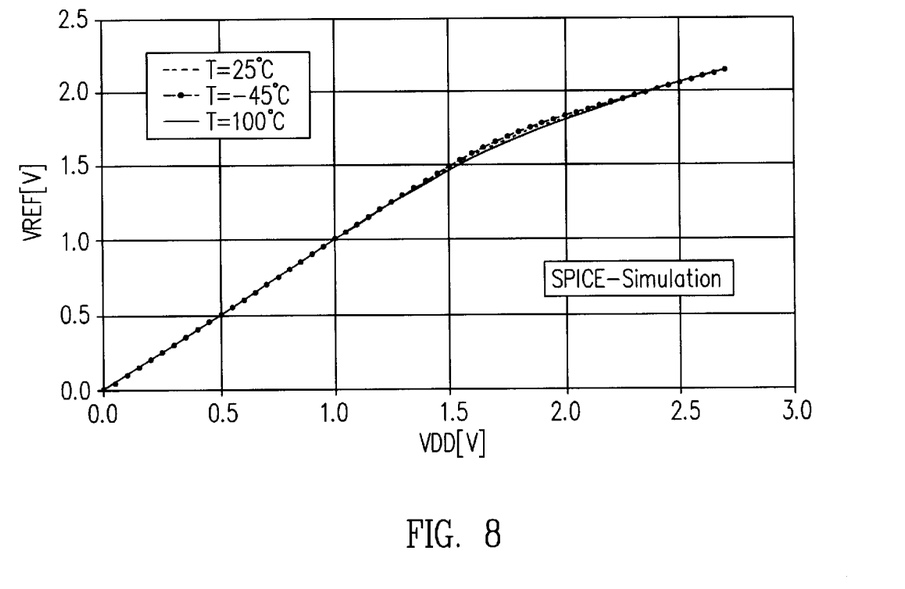
FIG. 8 illustrates the VREF-VDD relationship a simulated clamp circuit having the FIG. 7 configuration.

FIG. 8 shows the DC characteristics of a simulated circuit having the FIG. 7 configuration, particularly the temperature independence of the clamping characteristics. The current level of the clamp circuit 700 is proportional to the ratio of the widths of PMOS transistor 502 and PMOS transistor 504. The current level in the clamp circuit 700 can be increased by increasing the transistor width of the PMOS transistor 504. By keeping the width ratio constant, the VREF-VDD characteristics of the clamp circuit 700 will not change with increasing current level.

Figure 9:
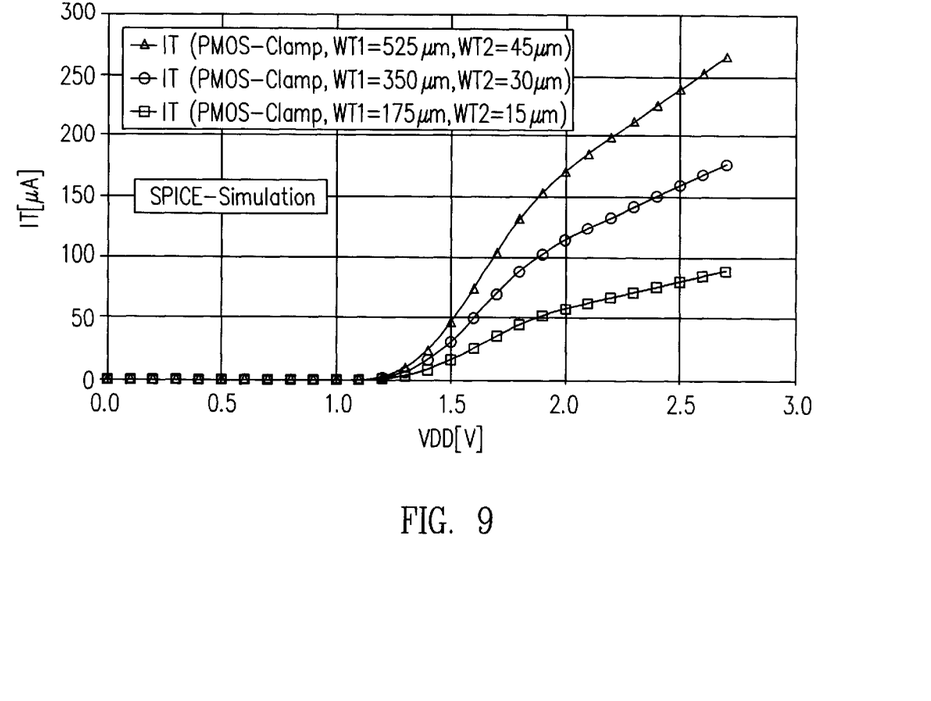
FIG. 9 illustrates the I-VDD relationship of the simulated FIG. 7 circuit for various simulated widths of the PMOS transistors.

It is recognized that the characteristics of the FIG. 7 PMOS clamp circuit 700 are not perfect. For example, VREF will increase even after the clamp voltage is reached. However, the variation of VREF for different temperatures and process parameter variations is smaller than that of diode/PNP clamp circuits. In general, the clamp characteristics of a PMOS clamp circuit such as that in FIG. 7 can be improved if a larger temperature coefficient can be tolerated (though temperature will still have much less effect than with the diode/PNP clamp circuits). Variations on the FIG. 7 circuit configuration to achieve improved clamp characteristics are described later. Now, however, the current capability of the FIG. 7 circuit is discussed. In particular, the current level of the PMOS clamp circuit 700 is proportional to the width of the PMOS transistors 502 and 504. This can be seen from FIG. 9, which is a graph derived from a simulated circuit having the configuration of FIG. 7. In FIG. 9, WT1 denotes the width of PMOS transistor 504 and WT2 denotes the width of PMOS transistor 502. It can be seen from FIG. 9 that the current supplied by the clamp circuit 700 is improved by increasing the transistor widths of PMOS transistors 504 and 502. Furthermore, by keeping the width ratio (WT1/WT2) constant, the VREF-VDD characteristics of the clamp circuit 700 is substantially unchanged with increasing current level.

Transistor 702 operates as a switching device to activate or disable the clamp circuit 700. When the gate of transistor 702 is biased to a positive voltage greater than the threshold point of the transistor 702, then the clamp circuit 700 is activated and the VREF voltage at terminal 107 will be clamped to the desired reference voltage. By grounding the gate of transistor 702, the clamp circuit 700 is inactivated and the voltage at terminal 107 will be just VDD.

Figure 10:
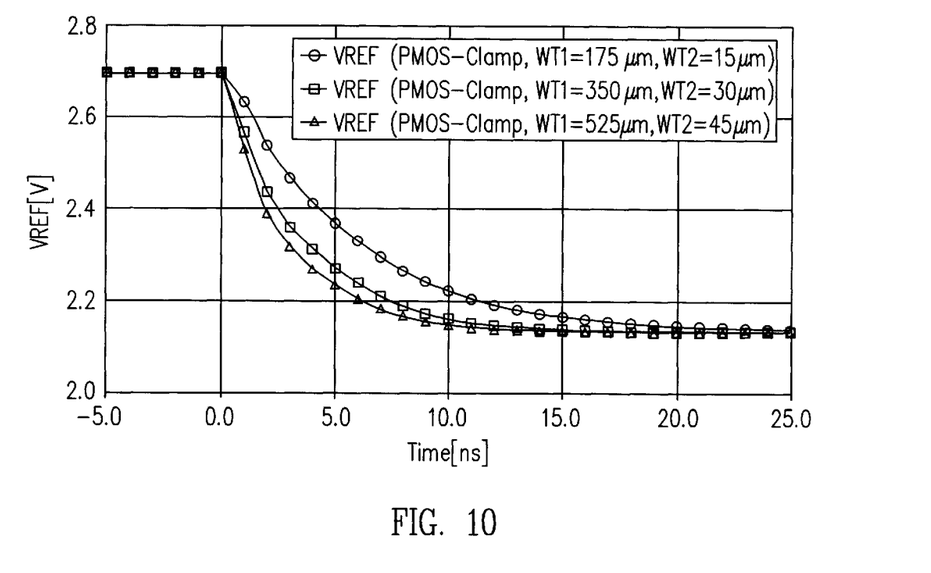
FIG. 10 illustrates transient characteristics of the simulated FIG. 7 circuit for the various PMOS transistor widths for which the I-VDD relationship is illustrated in FIG. 9.

The transient characteristics of a PMOS clamp circuit are now discussed. In general, the transient characteristics of a clamp circuit are primarily affected by the current level thorough the clamp devices. FIG. 10 illustrates the transient characteristics of a simulated circuit having the FIG. 7 configuration, with a capacitance load (Cload) equal to 2 pF at the VREF output 107. The time delay of switching is between 7 to 15 ns, depending on the transistor widths. This delay time is generally sufficient for use as a read voltage reference.

Figure 11:
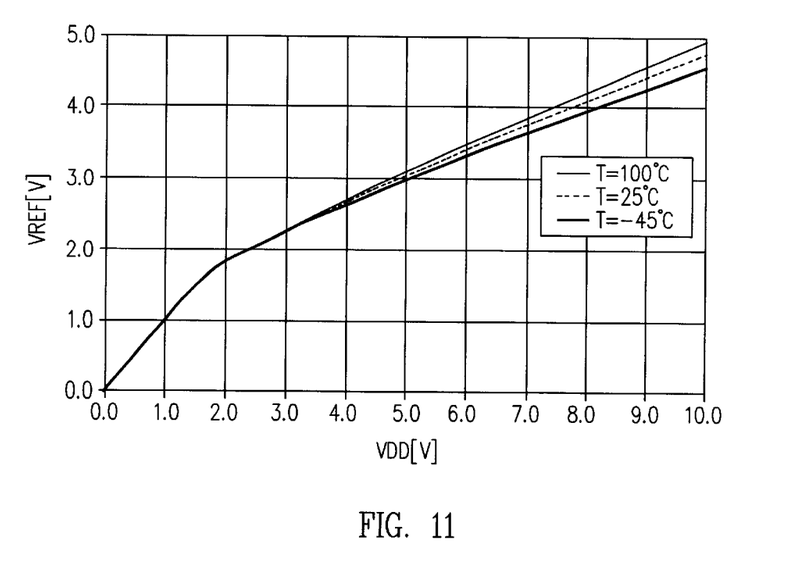
FIG. 11 illustrates the VREF characteristics of the simulated FIG. 7 circuit as a function of VDD, for various temperatures.

As was discussed earlier, the clamp characteristics of the PMOS clamp circuit 700 are not perfect in that VREF will increase even after reaching the clamp voltage. This effect could be a concern for overshooting of VREF at a high-VDD spike. However, as shown in FIG. 11 (derived from a simulated circuit having the FIG. 7 configuration), the FIG. 7 clamp circuit 700 exhibits an approximately 50% clamp ratio at high VDD (~10V), which is sufficient for most applications.

Figure 12:
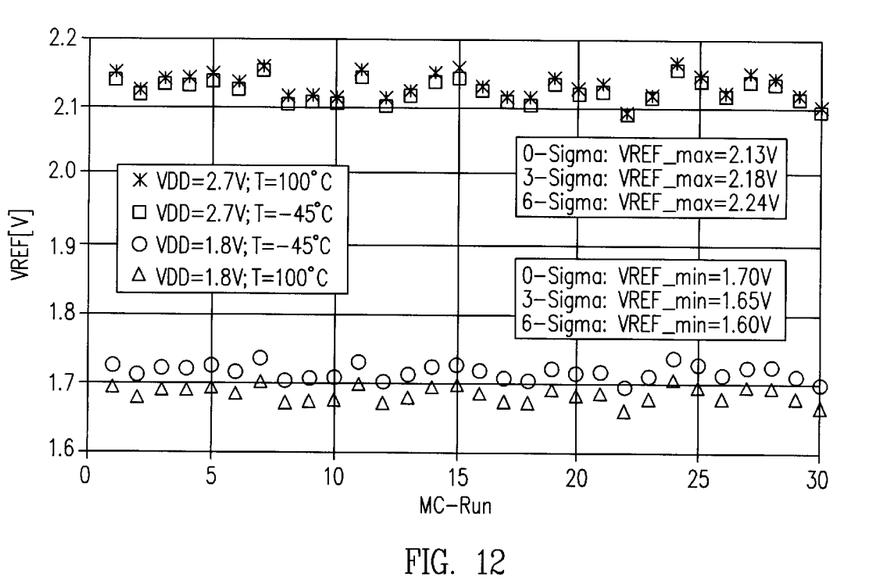
FIG. 12 illustrates the VREF results of Monte Carlo runs of the simulated FIG. 7 circuit for various process parameter variations of the PMOS transistors.

Conventionally, VT references are sensitive to variations in process parameters. However, the VT variation in submicron technologies (0.25μ/0.18μ) is smaller than pervious technologies. Based on foundry data and specifications, a Monte Carlo simulation for all possible corners (low and high temperatures, lowest and highest VDD including all process parameter variations) of the PMOS clamp circuit has been run. As shown in FIG. 12, the simulation indicates 50 mV is the 3-sigma variation of VREF. This variation is in tolerance for the read voltage.

In addition to increasing the transistor width, the clamp characteristics of the FIG. 7 circuit can also be improved by operating the PMOS device 502 in the high-current level region so that the increase of VREF after the clamp voltage is reached is minimized. Operating the PMOS transistor 502 in the high current region requires higher voltage at the gate terminal of the PMOS transistor 502.

Figure 13:
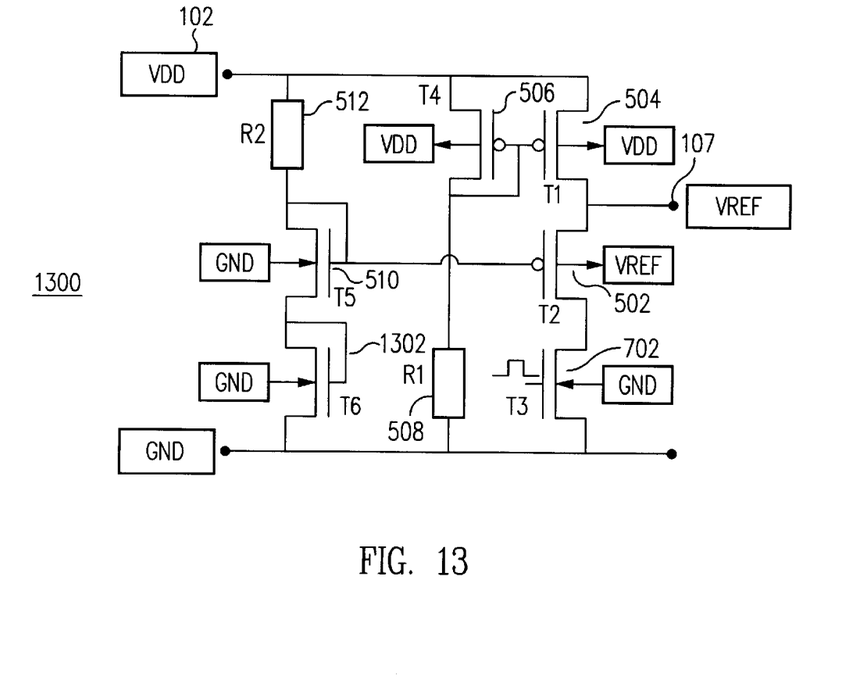
FIG. 13 illustrates another detailed embodiment of the FIG. 5 circuit, configured for the PMOS transistors to operate in the high-current level region.
Figure 14:
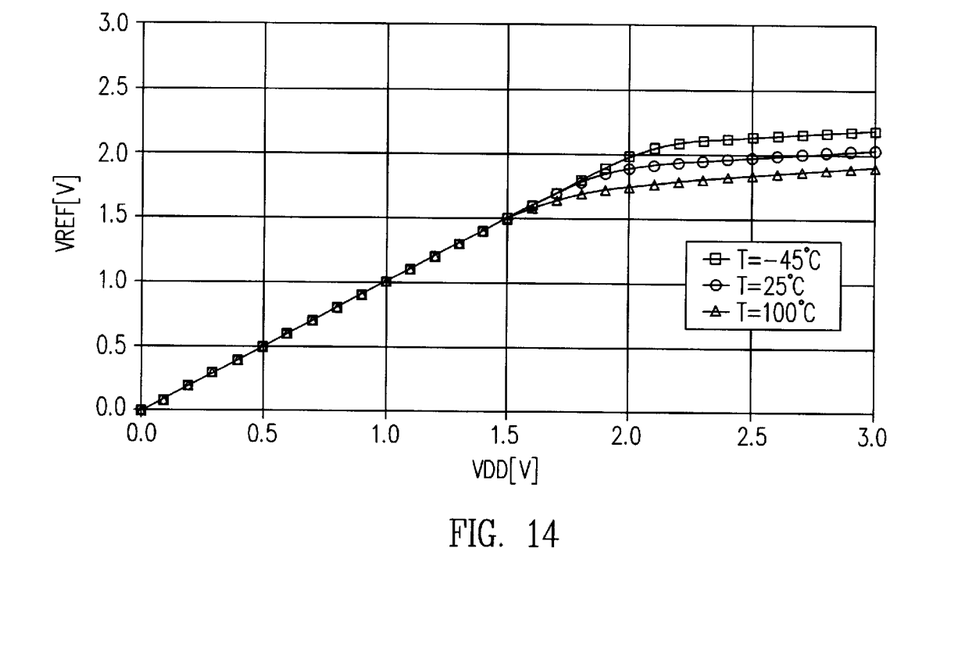
FIG. 14 illustrates VREF as a function of VDD for a simulation clamp circuit having the FIG. 13 configuration.

FIG. 13 illustrates one possible embodiment 1300 of the FIG. 7 circuit 700 in which the PMOS transistor 502 is operated in the high-current level region. The combination of resistance 512 and NMOS transistors 510 and 1302 provide a higher voltage at the gate of transistor 502, which drives transistor 502 into a high current region of operation. As can be seen from FIG. 14 (which is derived from a simulated circuit having the configuration of the FIG. 13 circuit), the clamp characteristics of the circuit 1300 are significantly improved. Operating the PMOS transistor 502 in the high-current region does require higher voltage at the gate terminal of the PMOS transistor 502 and a larger transistor width. Furthermore, operating the PMOS transistor 502 in the high-current level region does lead to temperature dependent characteristics, due to mobility effect. However, the temperature coefficient of PMOS clamp circuits such as the FIG. 13 clamp circuit 1300 is generally still less that that of diode/PNP circuits such as the FIG. 1 circuit 100.

In the FIG. 13 circuit 1300, as with the FIG. 5 circuit 500, the bulk of PMOS transistor 502 may be connected to the output terminal 107 to reduce the changes in VREF due to the threshold point.

There are circuit configurations other than the FIG. 5, FIG. 7 and FIG. 13 configurations that could suitably drive the PMOS clamp device 502. In general, the particular characteristics of operation (e.g., maximum temperature coefficient and the slope of VREF changes vs. VDD) are determined by the particular configuration employed.

In this description, a new concept for using PMOS devices in clamp circuits has been presented. The new clamp circuit shows weak temperature dependency behavior, which offers major advantages in some applications as compared to diode type clamp circuits.

What is claimed is:

1. A clamp circuit to provide a reference voltage based on a power signal provided from a power supply that has a power terminal and a common terminal, the clamp circuit comprising:
   an output terminal at which the reference voltage is provided;
   a first PMOS transistor coupled between the output terminal and the common terminal and having a gate for receiving a first bias voltage, the bulk of the first PMOS transistor is connected to either the power terminal or the output terminal; and
   a second PMOS transistor coupled between the power terminal and the output terminal and having a gate for receiving a second bias voltage, said output terminal being connected to only the first and second PMOS transistors within the clamp circuit.

2. The clamp circuit of claim 1, and further including gate voltage generating circuitry to generate the first bias voltage, wherein the gate voltage generating circuitry is configured to generate the first bias voltage to have a value that sets the threshold point of the first PMOS transistor such that the clamp circuit has particular desired clamp characteristics.

3. The clamp circuit of claim 1, wherein the first bias voltage and the transistor width of the first PMOS transistor are such that the first PMOS transistor operates with a temperature coefficient of substantially zero.

4. The clamp circuit of claim 1, wherein the bulk of the PMOS transistor is connected to the output terminal, whereby the clamp action of the clamp action of the clamp circuit acts to minimize the body effect of the PMOS transistor.

5. The clamp circuit of claim 1, wherein:
   the clamp circuit further includes:
      first bias voltage reference circuitry configured to control the first bias voltage; and
      second bias voltage reference circuitry configured to control the second bias voltage.

6. The clamp circuit of claim 5, wherein:
   the second bias voltage reference circuitry is configured to control the second bias voltage such that the second PMOS transistor operates with a temperature coefficient of substantially zero.

7. The clamp circuit of claim 1, wherein the clamp circuit is configured such that the second PMOS transistor operates in a high current level region of operation.

8. The clamp circuit of claim 1, wherein the bulk of the first PMOS transistor is connected to the output terminal, whereby the clamp action of the clamp circuit acts to minimize the body effect of the first PMOS transistor.

9. The clamp circuit of claim 1 and further including gate voltage generating circuitry to generate the second bias voltage, wherein the gate voltage generating circuitry is configured to generate the second bias voltage to have a value that sets the threshold point of the second PMOS transistor such that the clamp circuit has particular clamp characteristics.

10. The clamp circuit of claim 1, wherein the first bias voltage and transistor parameters of the first PMOS transistor are such that the first PMOS transistor operates with a temperature coefficient that is substantially zero.

11. The clamp circuit of claim 1, wherein the second bias voltage and transistor parameters of the second PMOS transistor are such that the second PMOS transistor operates with a temperature coefficient that is substantially zero.

12. A clamp circuit to provide a reference voltage based on a power signal provided from a power supply that has a power terminal and a common terminal, the clamp circuit comprising:
   an output terminal at which the reference voltage is provided;
   a first PMOS transistor having a first terminal coupled to the output terminal and having a second terminal spaced apart from the first terminal with a channel therebetween, and having a gate for controlling the flow of current in said channel;
   a second PMOS transistor having a first terminal coupled to the power terminal, having a second terminal spaced apart from the first terminal with a channel therebetween and coupled to the output terminal and having a gate for controlling the flow of current in said channel;
   a third PMOS transistor having a first terminal coupled to the power terminal, and having a second terminal spaced apart from the first terminal with a channel therebetween and coupled to a common node formed of the gates of the second and third PMOS transistors, and having a gate for controlling the flow of current in said channel;
   a first resistance element coupled between the second terminal of the third PMOS transistor and the common terminal;

a second resistance element coupled between the power terminal and the gate of the first PMOS transistor;

a first NMOS transistor having a first terminal coupled to the second resistance element, having a gate coupled to the common node formed of the first terminal of the first NMOS transistor and the gate of the first PMOS transistor, and having a second terminal spaced apart from the first terminal with a channel therebetween and coupled to the common terminal; and a second NMOS transistor having a first terminal coupled to the source of the first PMOS transistor, having a second terminal coupled to the common terminal, a second terminal spaced apart from the first terminal with a channel therebetween and coupled to the common terminal and having a gate for receiving a biasing voltage for activating the clamp circuit.

* * * * *